(12) United States Patent
Markowski

(10) Patent No.: US 7,602,155 B2
(45) Date of Patent: Oct. 13, 2009

(54) POWER SUPPLY PROVIDING ULTRAFAST MODULATION OF OUTPUT VOLTAGE

(75) Inventor: Piotr Markowski, Worcester, MA (US)

(73) Assignee: Artesyn Technologies, Inc., Boca Raton, FL (US)

( * ) Notice: Subject to any disclaimer, the term of this patent is extended or adjusted under 35 U.S.C. 154(b) by 17 days.

(21) Appl. No.: 11/190,642

(22) Filed: Jul. 27, 2005

(65) Prior Publication Data
US 2007/0024360 A1 Feb. 1, 2007

(51) Int. Cl.
*G05F 1/10* (2006.01)
*G05F 1/652* (2006.01)

(52) U.S. Cl. .................. 323/222; 323/282; 323/284

(58) Field of Classification Search ........... 323/222, 323/282, 284
See application file for complete search history.

(56) References Cited

U.S. PATENT DOCUMENTS

| | | | |
|---|---|---|---|
| 3,600,667 A | 8/1971 | Wynn | |
| 3,970,953 A | 7/1976 | Walker et al. | |
| 4,378,530 A | 3/1983 | Garde | |
| 4,502,152 A | 2/1985 | Sinclair | |
| 4,516,080 A | 5/1985 | Garde | |
| 5,682,303 A * | 10/1997 | Goad | 363/71 |
| 5,905,407 A | 5/1999 | Midya | |
| 6,009,000 A * | 12/1999 | Siri | 363/21.09 |
| 6,121,761 A | 9/2000 | Herbert | |
| 6,215,290 B1 * | 4/2001 | Yang et al. | 323/282 |
| 6,281,666 B1 * | 8/2001 | Tressler et al. | 323/272 |
| 6,292,378 B1 * | 9/2001 | Brooks et al. | 363/65 |
| 6,300,826 B1 | 10/2001 | Mathe et al. | |
| 6,346,798 B1 * | 2/2002 | Passoni et al. | 323/272 |
| 6,362,607 B1 * | 3/2002 | Wickersham et al. | 323/272 |
| 6,362,608 B1 * | 3/2002 | Ashburn et al. | 323/272 |
| 6,404,175 B1 * | 6/2002 | Yang et al. | 323/282 |
| 6,424,129 B1 * | 7/2002 | Lethellier | 323/272 |
| 6,449,174 B1 * | 9/2002 | Elbanhawy | 363/65 |

(Continued)

OTHER PUBLICATIONS

Asbeck et al., "Synergistic Design of DSP and Power Amplifiers for Wireless Communications," IEEE Trans. on Microwave Theory and Techniques, vol. 49, No. 11, Nov. 2001.

(Continued)

*Primary Examiner*—Bao Q Vu
(74) *Attorney, Agent, or Firm*—K&L Gates LLP

(57) ABSTRACT

A power supply for providing a modulated output voltage to a load is disclosed. According to various embodiments, the power supply comprises a plurality of parallel-connected switch-mode power modules and a controller. The controller is connected to each of the power modules and is for controlling the duty cycles of the respective power modules such that the power modules have a common duty cycle in steady state, but in a phase-shifted or "interleaved" manner. In addition, the controller is for controlling the output voltage of the power converter by controlling the ratio of power modules in the forward state at a time to the total number of power modules. In this way, by providing a sufficiently large number of power modules, arbitrarily low output voltage amplitudes and intra-level oscillations can be achieved. Further, the rate of modulation of the output voltage can exceed the switching frequency (f=1/T, where T is the switching period) of the power modules. An rf power amplifier system including such a power supply is also disclosed.

14 Claims, 10 Drawing Sheets

U.S. PATENT DOCUMENTS

Figure 1:
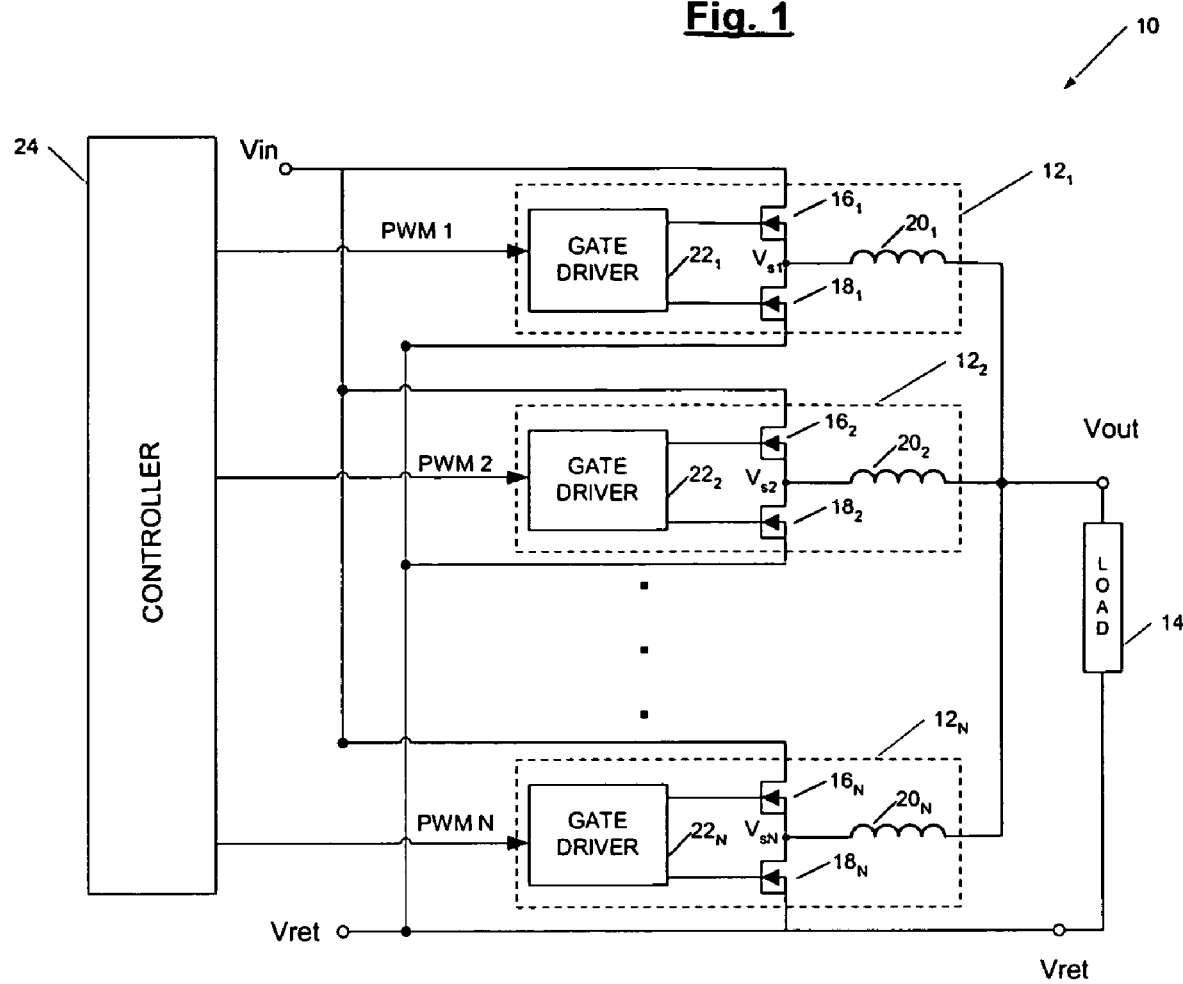

| | | | |
|---|---|---|---|
| 6,534,962 B1 * | 3/2003 | Lee .................. 323/290 |
| 6,583,664 B2 | 6/2003 | Mathe et al. |
| 6,642,631 B1 * | 11/2003 | Clavette ................ 307/52 |
| 6,650,096 B2 * | 11/2003 | Lee .................. 323/272 |
| 6,661,210 B2 | 12/2003 | Kimball et al. |
| 6,674,274 B2 * | 1/2004 | Hobrecht et al. ........ 323/285 |
| 6,833,760 B1 | 12/2004 | Aude |
| 6,850,045 B2 * | 2/2005 | Muratov et al. ........ 323/272 |
| 7,058,373 B2 | 6/2006 | Grigore |
| 7,071,662 B2 * | 7/2006 | Hsu et al. ............. 323/272 |
| 7,109,689 B2 * | 9/2006 | Schneider ............. 323/272 |
| 7,126,315 B2 * | 10/2006 | Seo .................. 323/272 |
| 7,190,150 B2 | 3/2007 | Chen et al. |
| 2002/0135338 A1 * | 9/2002 | Hobrecht et al. ........ 323/272 |

OTHER PUBLICATIONS

Sahu et al., "System-Level Requirements of DC-DC Converters for Dynamic Power Supplies for Power Amplifiers," 2002 IEEE Asia-Pacific Conference on ASICs (2002).

Sahu et al., "High-Efficiency Linear RF Power Amplifier With a Power-Tracking Dynamically Adaptive Buck-Boost Supply," IEEE Trans. on Microwave Theory and Techniques, vol. 52, No. 1, Jan. 2004.

Yundt, George B., "Series Parallel Connected Composite Amplifiers," Jun. 1983, Master Thesis, Massachusetts Institute of Technology, pp. 1-359.

Kashiwagi, Seigoh, "A High-Efficiency Audio Power Amplifier Using a Self-Oscillating Switching Regulator," IEEE Transactions on Industry Applications, Jul./Aug. 1985, vol. IA-21, No. 4, pp. 906-911.

Ertl et al., "Basic Considerations and Topologies of Switched-Mode Assisted Linear Power Amplifiers," Proc. of the 11th Applied Power Electronics Conference, IEEE, 1996, pp. 207-213.

van der Zee et al., "A Power Efficient Audio Amplifier Combining Switching and Linear Techniques," Proc. of the 24th European Solid-State Circuits Conference, 1998, pp. 288-291.

Yousefzadeh et al., "Band Separation and Efficiency Optimization in Linear-Assisted Switching Power Amplifiers," Proc. of the 37th Power Electronics Specialists Conference, 2006, 7 pages.

Zhou et al., "Switch-Linear Hybrid Power Conversion (I)—The Topologies Based on Source Follower," IEEE, 2006, 7 pages.

Hu et al., "Switch-Linear-Hybrid Power Converter and Its Application Prospect in Industry," IEEE, 2006, pp. 1009-1014.

* cited by examiner

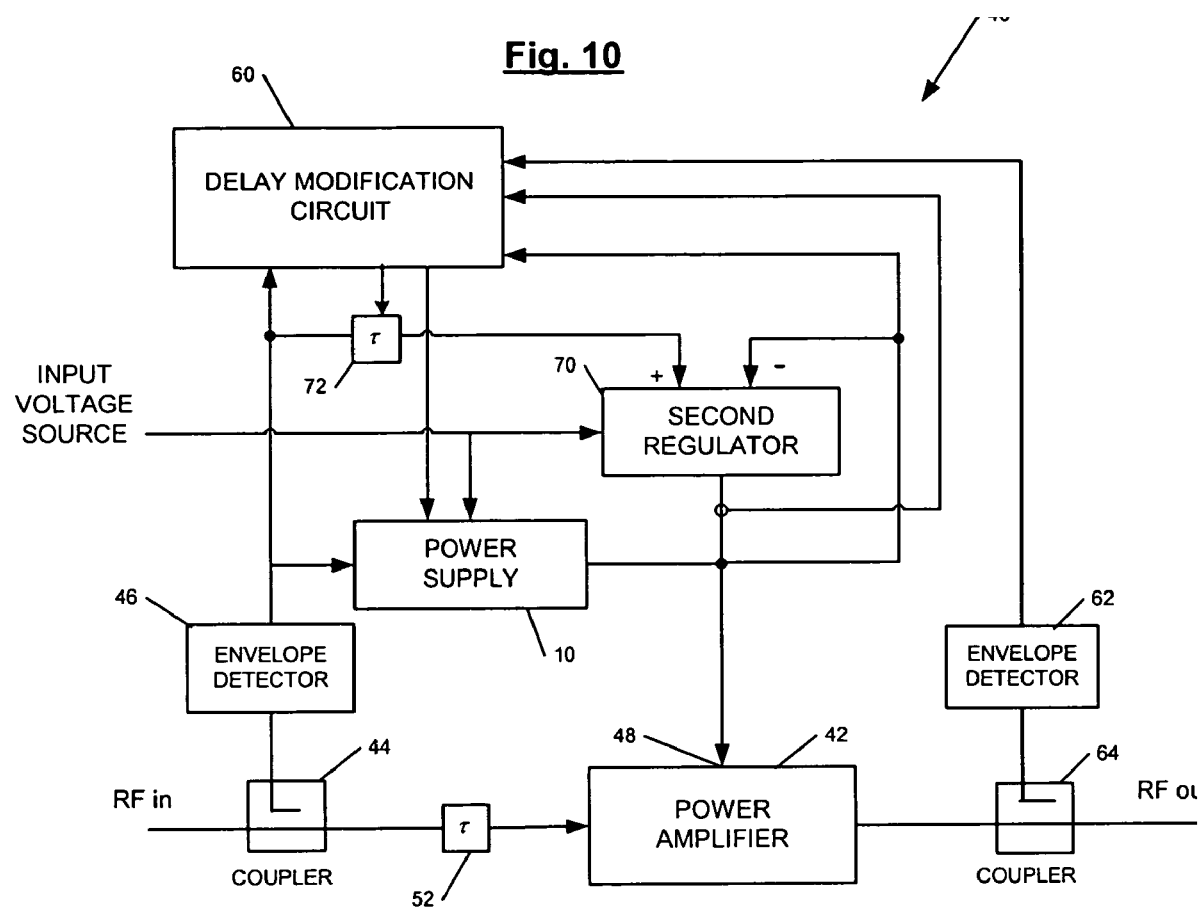

US 7,602,155 B2

POWER SUPPLY PROVIDING ULTRAFAST MODULATION OF OUTPUT VOLTAGE

BACKGROUND

The present invention generally concerns power conversion circuits.

A number of different electronic devices require very fast modulation of their supply voltage. One such type of electronic devices is radio frequency (rf) linear power amplifiers. Such amplifiers are widely used in modern wireless communication devices and infrastructure. In complex modulation schemes commonly used in wireless communications like QPSK, CDMA, WCDMA, the amplitude of the envelope of the rf signal varies significantly. At every instance when the envelope of the rf signal is substantially lower than the maximum allowed by the supply voltage, the efficiency of the power amplifiers is severely reduced. In other words, a significant portion of the supply energy is expensed only for maintaining the power amplifier's operating point (bias) without creating useful signal. There are a number of adverse effects caused by this phenomenon, including (i) the need to oversize the expensive rf components in the amplifier system, (ii) increased cooling requirements, (iii) increased size and weight of equipment, and (iv) increased consumption of electrical energy. If, on the other hand, the supply voltage is changed in accordance with the envelope of the rf signal, the operating point of the power amplifiers can be kept at or near optimum at all times. As a result, efficiency can be maintained at a high level, regardless of the instantaneous amplitude of the envelope of the rf signal.

However, while rf power amplifiers ordinarily require very fast modulation of their supply voltage for improved efficiency, most available electronic energy sources are designed to maintain a constant, well-regulated output voltage and are required to vary their output voltage only at relatively slow rates. For example, the CDMA baseband frequency is 1.25 MHz and the WCDMA baseband frequency is 5 MHz. This results in an rf signal envelope having the most energy in the band 0-1.25 MHz and 0-5 MHz respectively. Multichannel amplifiers, on the other hand, experience envelope variations due to the interactions between different carrier frequencies. In such a situation, the rf signal envelope experiences amplitude variation with frequency components reaching the difference in carrier frequency of extreme channels (two channels with the greatest difference of the carrier frequency). The envelope frequency in this case can be on the order of hundreds of kHz to tens of MHz. If the bandwidth of the power supply is insufficient, distortion results and additional noise in the communication channels emerge, which results in an increased error rate in the communication channel. The present modulation rate goals are two to three orders of magnitude greater than what can be achieved by simply modulating a pwm signal of traditional dc-dc converters. This makes traditional pwm dc-dc converters unsuitable as power supplies for devices, such as rf power amplifiers, that require ultrafast modulation of their supply voltage.

SUMMARY

In one general aspect, the present invention is directed to a power supply for providing a modulated output voltage to a load. According to various embodiments, the power supply comprises a plurality of parallel-connected switch-mode power modules and a controller. The controller is connected to each of the power modules and is for controlling the duty cycles of the respective power modules such that the power modules have a common duty cycle in steady state, but in a phase-shifted or "interleaved" manner. In addition, the controller is for controlling the output voltage of the power converter by controlling the ratio of power modules in the forward state at a time to the total number of power modules. In this way, by providing a sufficiently large number of power modules, arbitrarily low output voltage amplitudes and intra-level oscillations can be achieved. Further, the rate of modulation of the output voltage can exceed the switching frequency of the power modules. This makes embodiments of the power supply suitable for the dynamic source voltage requirements of rf linear power amplifiers and other applications that require fast source voltage modulation.

According to various implementations, the power modules do not include a discrete output filter capacitor. Also, the power modules may comprise any of a number of switch-mode topologies, including buck, boost or buck-boost converters and converters derived from those topologies. Also, the power modules may be voltage-fed or current-fed.

To further enhance the modulation frequency of the power supply, modulation of the output voltage can be obtained without the use of voltage feedback. This is possible because the power supply preferably has no or very little output capacitance. This, in turn, results in a flat gain characteristic of the power stage up to the maximum modulation frequency, which may be above the switching frequency of the power supply. If so, the amplitude of the output voltage will follow the command signal reference (average duty cycle) with reasonable accuracy in an open loop arrangement. Such an open loop arrangement, in turn, removes the problem of potential instability and difficulties with compensating the closed loop system caused by inherent delays in the power processing path of the switching converter. As a result, much higher modulation frequencies can be achieved.

Further improvement in speed and accuracy can be achieved if a high bandwidth regulator in a closed loop arrangement (for example, a low efficiency linear regulator) is combined with an open-loop switched power supply as described above. This combination may allow high efficiency processing of a majority of the power density spectrum by the switched power supply and only the high end portion of the power density spectrum (plus possible accuracy adjustments) by the linear regulator. The control signal to the linear regulator is preferably delayed for a duration matching the delay of the open-loop switching power supply.

In order to compensate for uncertainty and drift of the delay introduced by the switching power supply, an adaptive mechanism for controlling the delay in the control signal to the linear regulator can be added to the circuit.

FIGURES

Figure 2:
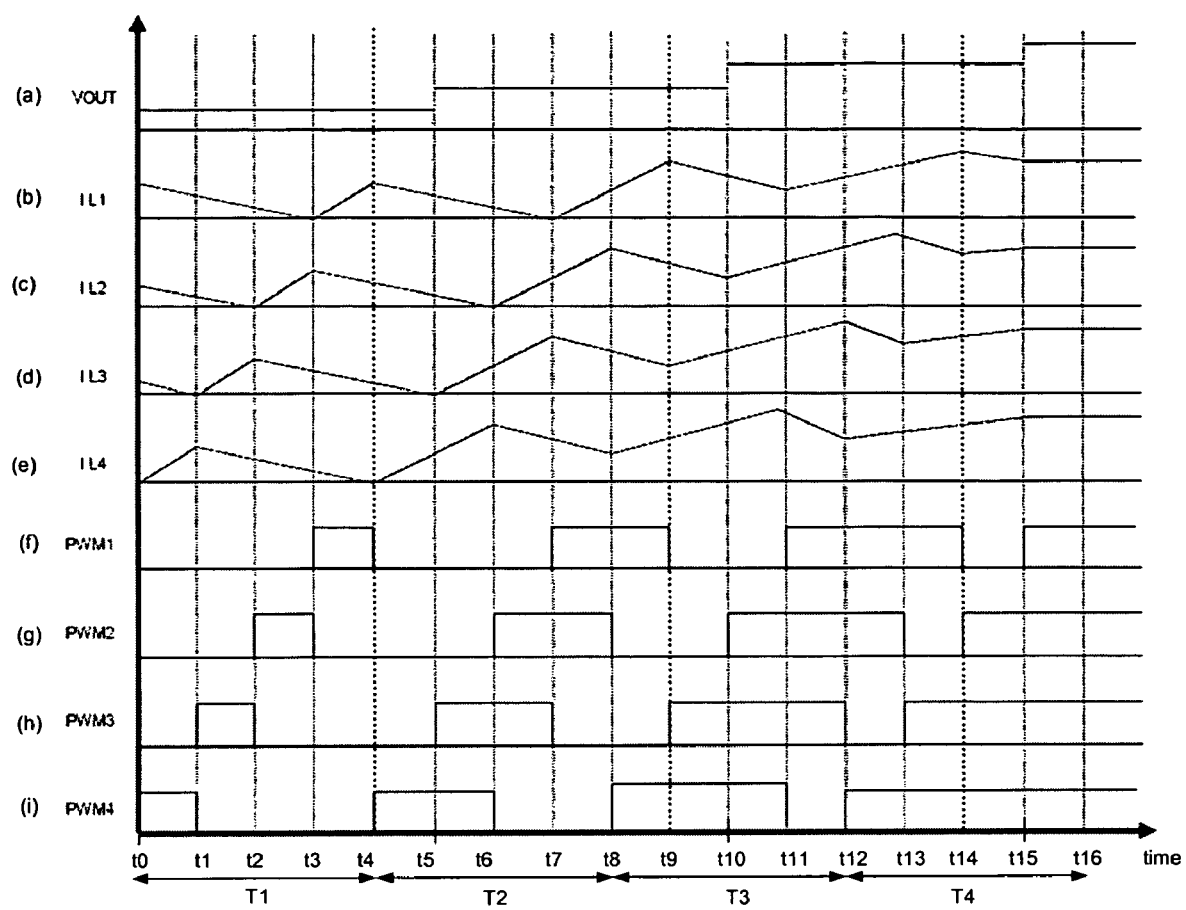
Figure 3:
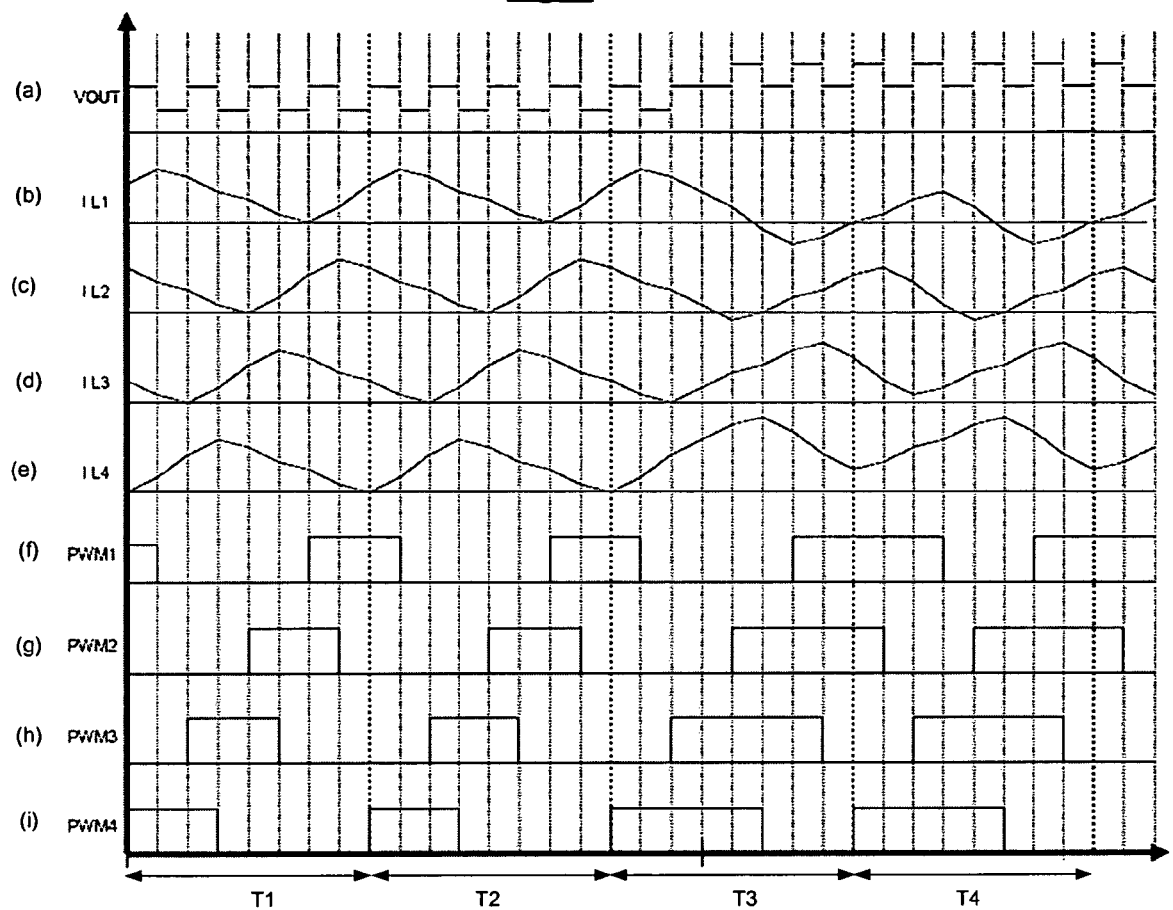
Figure 4:
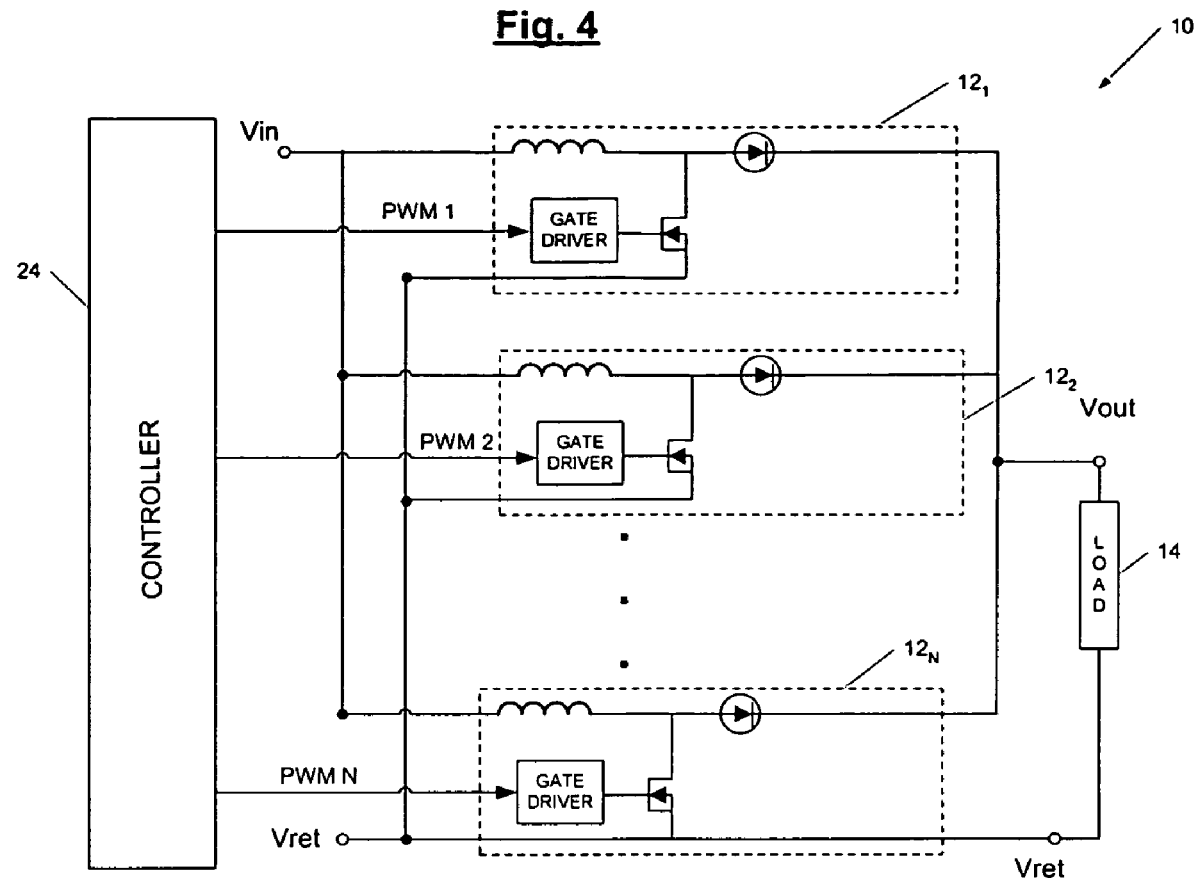
Figure 5:
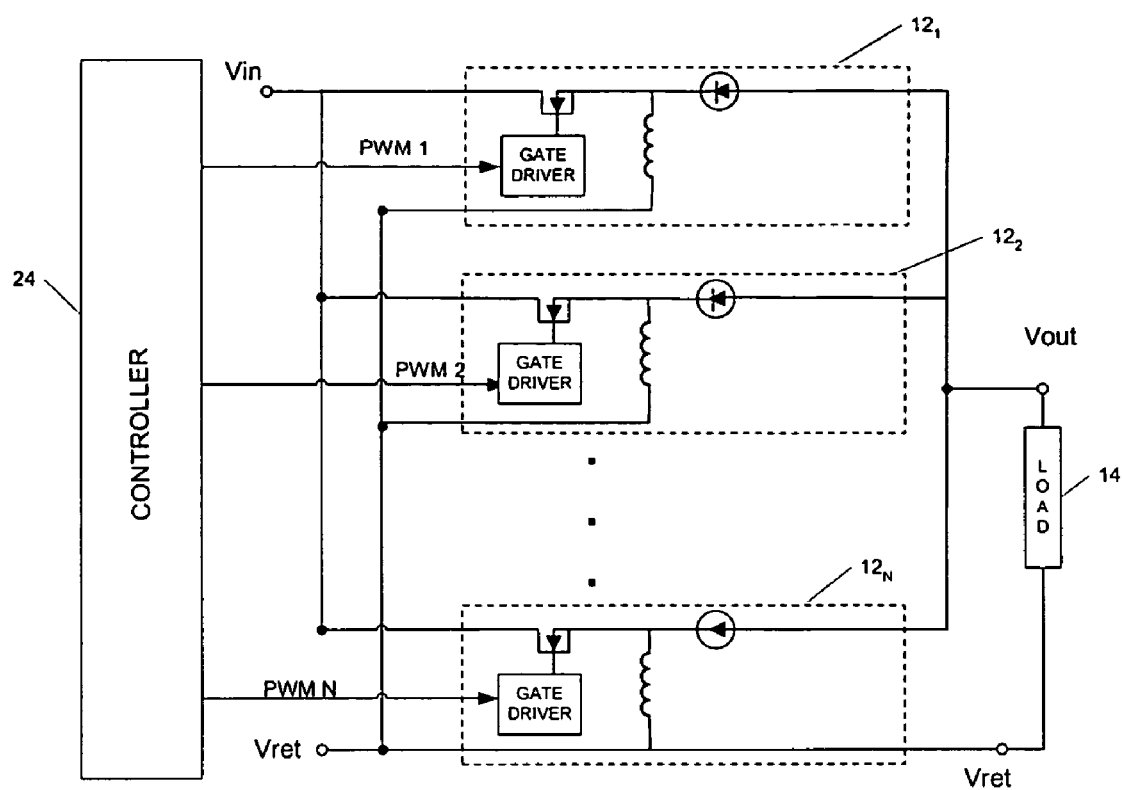

Various embodiments of the present invention are described herein by way of example in conjunction with the following figures, wherein:

FIG. 1 is a diagram of a power supply according to various embodiments of the present invention;

FIGS. 2(*a*)-(*i*) and FIGS. 3(*a*)-(*i*) are idealized waveforms demonstrating the operation of the power supply of FIG. 1 according to various embodiments of the present invention;

FIGS. 4 and 5 are diagrams of the power supply according to other embodiments of the present invention; and FIGS. 6-10 are block diagrams of power amplifier systems according to various embodiments of the present invention.

DETAILED DESCRIPTION

FIG. 1 is a diagram of a power supply 10 according to various embodiments of the present invention. The power supply 10 includes a number (N) of parallel-connected, switch-mode power modules $12_{1-N}$. The power modules $12_{1-N}$ may each convert a common input voltage (Vin) to respective output voltages of the same average amplitude, which allow the modules $12_{1-N}$ to be connected together (Vout) as shown in FIG. 1 to power a load 14.

Each of the power modules $12_{1-N}$ may be identical in structure but operated, as explained in more detail below, in a phase-shifted (or "interleaved") manner relative to each other. As shown in FIG. 1, according to one embodiment, each power module $12_{1-N}$ may include, for example, a synchronous buck converter. In that connection, the power modules $12_{1-N}$ may include, among other things, a power switch $16_{1-N}$, a synchronous rectifier $18_{1-N}$, an output inductor $20_{1-N}$ and a gate driver $22_{1-N}$ for providing the gate signals to the power switches $16_{1-N}$ and the synchronous rectifiers 181-N. The converter 10 may also include a controller 24 for outputting PWM control signals to the respective power modules $12_{1-N}$ to control the on/off times of the power switches $16_{1-N}$ and the synchronous rectifiers $18_{1-N}$. The power processing operation of synchronous buck converters is known in the art and is, therefore, not further explained herein. In addition, it should be noted that other switch-mode topologies could be used for the power modules $12_{1-N}$. For example, the power modules $12_{1-N}$ may include other types of isolated or non-isolated buck or buck-derived power stages. Also, boost or buck-boost and/or current fed topologies may be used. The present invention accordingly is not limited to the synchronous bucks shown in FIG. 1.

Also, as shown in exemplary embodiment of FIG. 1, the power modules $12_{1-N}$ need not include a discrete output capacitor, as is included in most converter topologies. Thus, the output filter for the power supply 10 in such embodiments comprises only the inductance from the inductors $20_{1-N}$ and the implicit effective resistance of the load 14, neglecting the effect of parasitic capacitance, which is ordinarily inconsequential to the operation of the power supply 10.

The controller 24, according to various embodiments, may be implemented as a programmable digital controller. The power modules $12_{1-N}$ may alternatively connect the Vsi node ($1 \leq i \leq N$) of the power modules $12_{1-N}$ (see FIG. 1) to Vin or Vret depending on the logic level of the PWM signals supplied to the respective power modules $12_{1-N}$. Thus, at any give time, a certain number of power modules 12 will be in the forward state (i.e., Vsi equals Vin) and the rest will be in the freewheeling state (i.e., Vsi equals Vret) (neglecting transition states). During steady state operation all of the PWM control signals (PWM 1 to PWM N) may be characterized by the same duty cycle. The respective PWM signals, however, may be shifted in phase by a T/N relative to each other, where T is the switching period of the power modules $12_{1-N}$ and N is the number of modules.

The regulation of the output voltage (Vout) may be achieved by changing the number of power modules $12_{1-N}$ in the so-called "forward" state relative to the total number of power modules. Thus, the steady state output voltage of the power converter (neglecting transition from one stable voltage level to another) is equal to:

$$\text{Vout}(t) = \text{Vin} \cdot k(t)/N \quad (1)$$

where N is the total number of power modules 12 (regardless of their state) and k(t) is the number of power modules 12 that are in the forward (or high) state at time t.

This operation can be understood through the idealized waveforms of FIGS. 2(a)-(i). In this example, the power supply 10 has four power modules (N=4), with each module 12 operated ninety (90) degrees of phase relative to the next module. The waveforms of FIGS. 2(f)-(i) show the PWM control signals for the respective power modules 12, the waveforms of FIGS. 2(b)-(e) show the current in the inductor 20 of each module 12, and the waveform of FIG. 2(a) shows the output voltage of the converter 10.

As can be seen, in time period T1 each power module has a duty cycle of 25%. As such, only one of the four modules 12 is in the forward (or high) state at any one time. Thus, the output voltage is one unit. During time period T2, each power module 12 has a duty cycle of 50%. As such, starting at time t5 and lasting until time t10, two of the four modules 12 are in the forward state at a time. The output voltage (Vout) is thus two units (i.e., twice as great as during time period t0 to t5). In time period T3, the duty cycle as 75% for each module 12. As a result, starting at time t10 and lasting until time t15, three of the four modules 12 are in the forward state at a time. The output voltage (Vout) is, therefore, three units (or three times greater than during time period t0 to t5). Thus, as can be seen in these waveforms, the output voltage can be varied by varying the duty cycle of the PWM signals to control the number of modules 12 in the forward state at any one time pursuant to equation (1) above.

The waveforms of FIG. 3 show further design possibilities. In the waveforms of FIG. 3, the duty cycle (D) of the modules 12, unlike the situation in FIG. 2, does not belong to the finite set of values:

$$D_{set} = \{k/N\}$$

where N is total number of modules (N=4 in the example of FIG. 3) and k is any integer from 0 to N (i.e., $0 \leq k \leq N$). For example, in FIG. 3, during time periods T1 and T2, the duty cycle of the modules is $\frac{3}{8} = 37.5\%$. Starting at time period T2, the duty cycle transitions to $\frac{5}{8} = 62.5\%$. As can be seen in the waveform of FIG. 3(a), in such circumstances the output voltage oscillates between two adjacent stable levels determined by equation (1). Consequently, by providing a sufficiently large number of power modules 12, arbitrarily low voltage amplitudes and intra-level oscillations can be achieved. Further, the rate of modulation of the output voltage can exceed the switching frequency (f=1/T, where T is the switching period) of the power modules 12. This makes embodiments of the power supply 10 of FIG. 1 suitable for the dynamic source voltage requirements of rf linear power amplifiers and other applications that require fast source voltage modulation.

FIG. 4 is a diagram of an embodiment of the power supply 10 using boost converters as the power modules 12. Synchronous boost converter could be used in yet other embodiments. FIG. 5 is a diagram of an embodiment using buck-boost converters as the power modules 12. Again, synchronous buck-boost converters could be used in other embodiments. Also, converter topologies derived from these topologies may be used.

Figure 6:
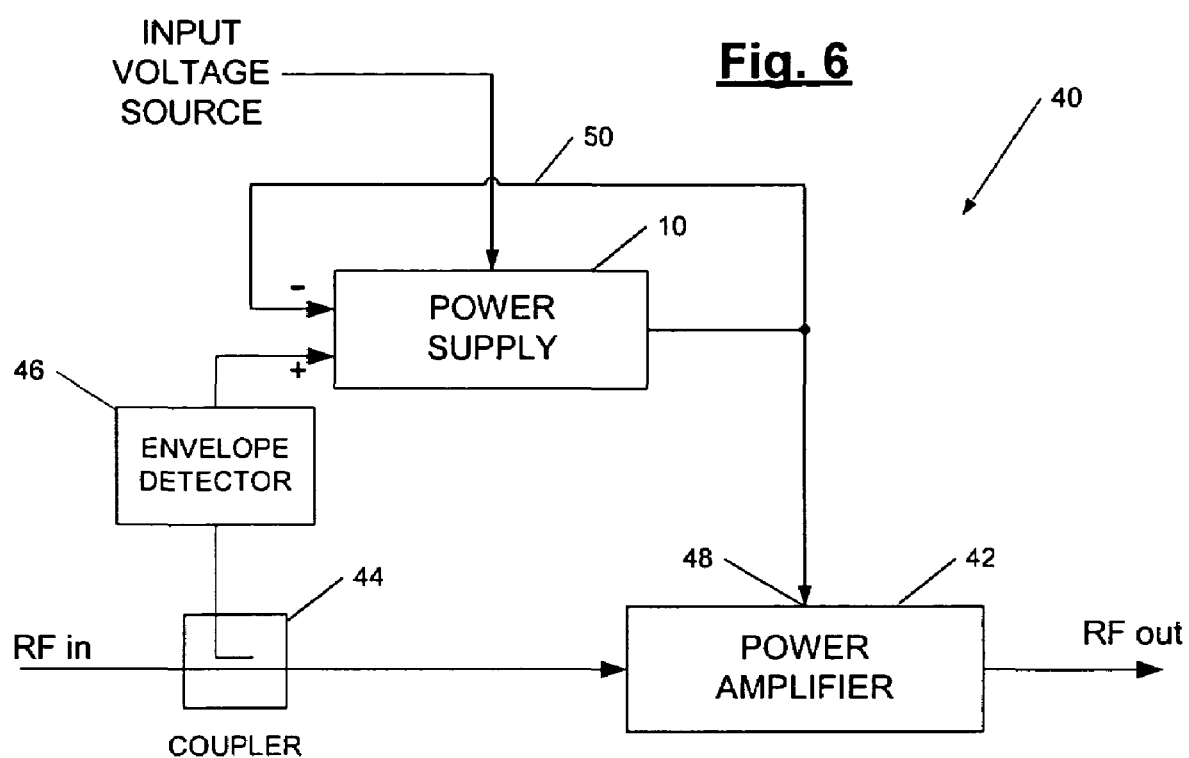

FIG. 6 is a simplified block diagram of a power amplifier system 40 according to various embodiments of the present invention. The power amplifier 42 amplifies an input rf signal (RF in) to produce an output rf signal (RF out). The power amplifier 42 may have one or many amplification stages. A sample of the rf input signal is coupled, via a coupler 44, to an envelope detector 46. The envelope detector 46 detects the envelope of the input rf signal. The voltage supplied by the power supply 10 to the power amplifier 42 via a supply voltage input 48 is proportional to the detected envelope signal. A feedback signal 50 is added to compensate for the error introduced by the power supply 10. Thus, the system 40 of FIG. 6 may be considered to have a "closed-loop" power supply 10. As described above, the power supply 10 may modulate the supply voltage applied to the power amplifier 42 to match the dynamic input supply voltage requirements of the power amplifier 42. For purposes of simplicity, other well-known components of a power amplifier system are not shown in FIG. 6. Additional modifications of the supply voltage may also be performed to achieve other objects for the system, such as linearity or a certain distortion level.

Figure 7:
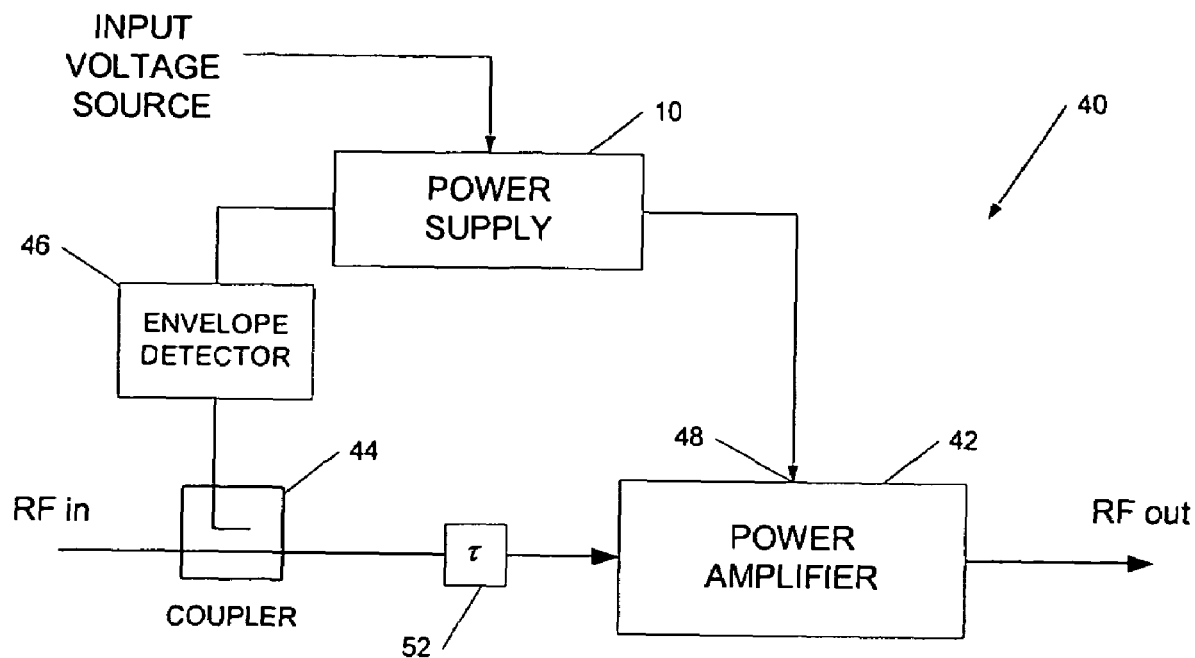

FIG. 7 is a simplified block diagram of the power amplifier system 40 according to another embodiment of the present invention. In order to increase the modulation bandwidth, in the embodiment of FIG. 7 the feedback signal 50 of the power supply 10 (see FIG. 6) is omitted. Thus, the power supply 10 of FIG. 7 may be considered an "open-loop" power supply. By removing the feedback loop, a delay becomes apparent in the system. This delay is introduced by the PWM generation circuit, gate drivers and power transistors of the power supply 10 (for embodiments of the power supply 10 with no discrete output capacitor, the output filter does not introduce any meaningful delay as it was explained previously). In order to match the rf signal envelope with the modulated supply voltage, a matching delay may be introduced in the signal driving the rf power amplifier by a delay circuit 52. This modification can be also viewed as trading delay for bandwidth, as well-known concept in the art.

Figure 8:
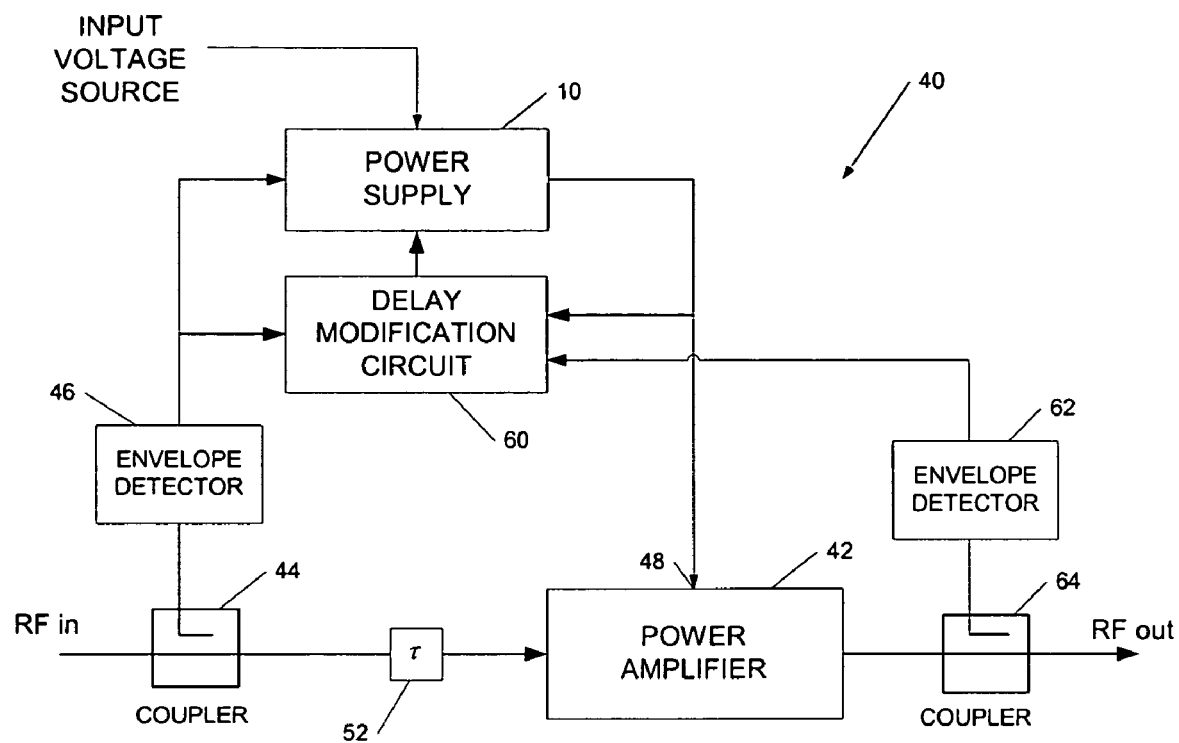

FIG. 8 shows another embodiment of the power amplifier system 40. The embodiment of FIG. 8 is essentially the same as FIG. 7 with the addition of the delay modification circuit 60. The delay introduced by the power supply 10 is to the first degree constant, regardless of the spectrum of the processed signal, thanks to the open loop arrangement for the power supply 10. This delay, however, experiences exact value uncertainty and drifts. High frequency modulation benefits from an arrangement in which such delay would be adjusted to best match the desired value. This role may be performed by the delay modification circuit 60, which may be based on Phase Lock Loop principle or other circuit techniques known in the art. The delay modification circuit 60 provides a delay adjustment signal to the power supply 10 so that it has the desired value. As shown in FIG. 8, the delay modification circuit 60 may receive input and/or output envelope signals from input and output envelope detectors 46, 62. A sample of the output RF signal may be provided to the output envelope detector 62 by an output coupler 64.

Figure 9:
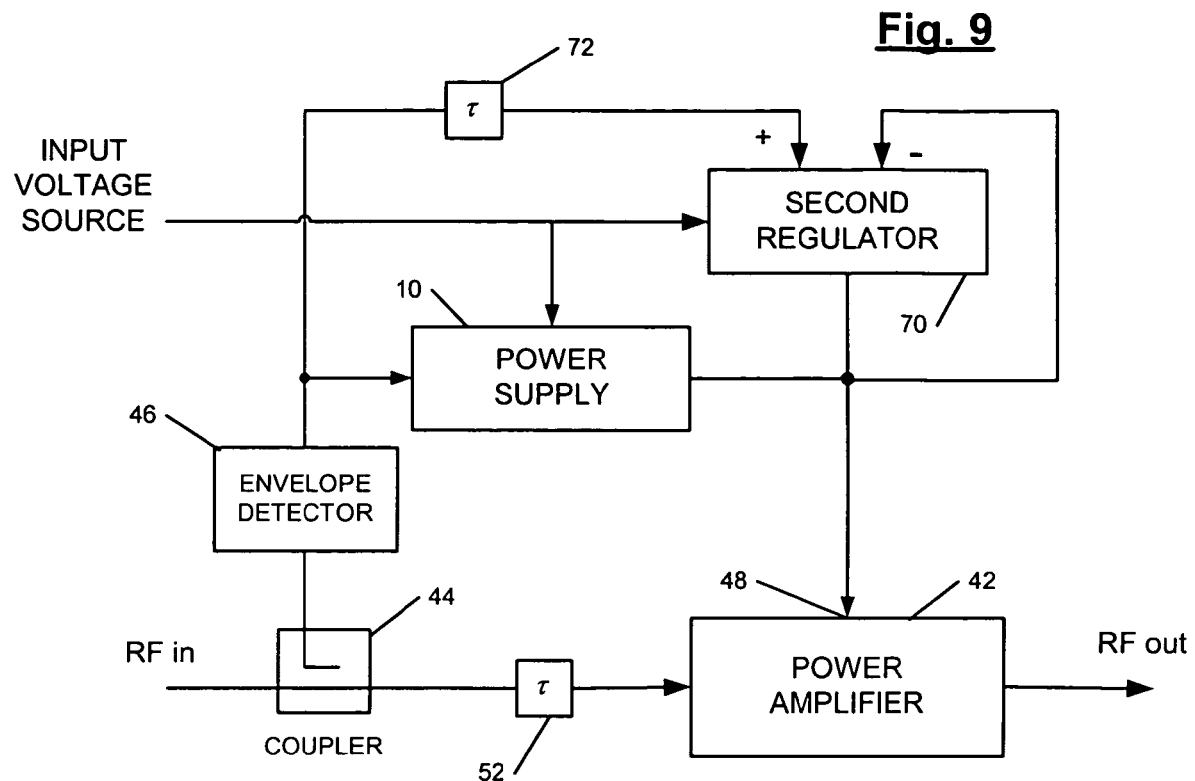

FIG. 9 shows another embodiment of the power amplifier system 40. In this embodiment, a second, closed-loop regulator 70 is added in parallel to the main switching, open-loop regulator (i.e., the power supply 10). The second regulator 70 is preferably realized as a linear regulator (series pass or shunt) or as a switching regulator operating at a substantially higher switching frequency than the main switching regulator 10 (and hence having much higher bandwidth). The purpose of the second regulator 70 is to provide fast and precise adjustment of the regulated voltage supplied to the power amplifier 42. The role of the second regulator 70 in frequency domain may be described as providing regulation in the part of the frequency spectrum exceeding the bandwidth of the main switching regulator 10. The second regulator 70, by having a substantially higher switching frequency, may have substantially lower efficiency, yet overall efficiency of the system 40 may be affected only to a small degree due to the relatively minor contribution of the highest frequencies in the overall power density spectrum.

The second regulator 70 may operate in a closed loop arrangement, as shown in FIG. 9, to provide accurate response. If matched with an open-loop switching converter 10 (as shown in FIG. 9), a delay circuit 72 is preferably used to provide the second regulator 70 with a delay in its control signal that is matched with the delay from the delay circuit 52 introduced in the rf signal path. The closed loop arrangement of the second regulator 70 does not cause the stability problems mentioned before because of the much smaller internal delays due to, for example, the higher switching frequency or the linear structure of the second regulator 70. This system configuration can be understood as a combination of a highly efficient switching regulator (i.e., power supply 10) delivering the bulk of the power with coarse regulation and a possibly less efficient, fast regulator (i.e., second regulator 70) that provides fine regulation.

FIG. 10 provides yet another embodiment of the power amplifier system 40. The embodiment of FIG. 10 is similar to that of FIG. 9, except that in FIG. 10 a delay modification circuit 60 is used, like in the embodiment of FIG. 8. In this scheme, the delay of the main switching regulator (power supply 10) and the delay of the second regulator 70 are adjusted by the delay modification circuit 60 to assure the best matching between the input rf envelope and modulated supply voltage. The delay modification circuit 60 may also provide feedback to the delay circuit 72 if necessary so that the delays of the delay circuits 52, 72 match.

Although the present invention has been described herein with respect to certain embodiments, those of ordinary skill in the art will recognize that many modifications and variations of the present invention may be implemented. For example, as explained above, current-fed power modules may be used. Also, in embodiments of the power amplifier system 40 such as shown in FIGS. 8-10, other types of switching power supplies besides those described herein in connection with FIGS. 1-5 may be used as the open-loop power supply 10. The foregoing description and the following claims are intended to cover all such modifications and variations.

What is claimed is:

1. A power supply for providing a modulated output voltage to a load comprising:
   a plurality of non-synchronized, parallel-connected switch-mode power modules, wherein each module comprises:
      first and second switching transistors connected across first and second input voltage nodes, wherein a drain terminal of the first transistor is connected to the first input voltage node, a source terminal of the first transistor is connected to a drain terminal of the second transistor at a common node, and a source terminal of the second transistor is connected to the second input voltage node; and
      an inductor having a first terminal connected to the common node between the first and second transistors, and a second terminal connected to the output of the power supply; and
   a controller connected to each of the power modules for controlling the time duration of a forward state for each power module, wherein the forward state is when the first transistor is conductive and the second transistor is nonconductive, wherein the controller is for controlling the output voltage of the power converter by controlling the ratio of power modules in the forward state at a time to the total number of power modules, wherein the controller controls the power supply modules without output voltage feedback.

2. The power supply of claim 1, wherein the power modules do not include a discrete output filter capacitor.

3. The power supply of claim 2, wherein each power module comprises a buck converter.

4. The power supply of claim 3, wherein each power module comprises a synchronous buck converter.

5. The power supply of claim 1, wherein the controller is for controlling the output voltage of the power such that the rate of modulation of the output voltage exceeds the switching frequency of the power modules.

6. A power amplifier system comprising:
a power amplifier for amplifying an input rf signal; and
a first power supply connected to the power amplifier for supplying a supply voltage to the power amplifier, wherein the first power supply comprises:
a plurality of parallel-connected switch-mode power modules, wherein each module comprises:
first and second switching transistors connected across first and second input voltage nodes, wherein a drain terminal of the first transistor is connected to the first input voltage node, a source terminal of the first transistor is connected to a drain terminal of the second transistor at a common node, and a source terminal of the second transistor is connected to the second input voltage node; and
an inductor having a first terminal connected to the common node between the first and second transistors, and a second terminal connected to the output of the power supply; and
a controller connected to each of the power modules for controlling the time duration of a forward state for each power module, wherein the forward state is when the first transistor is conductive and the second transistor is nonconductive, wherein the controller is for controlling the output voltage of the first power supply by controlling the ratio of power modules in the forward state at a time to the total number of power modules, wherein the controller controls the power modules without output voltage feedback.

7. The power amplifier system of claim 6, wherein the power modules do not include a discrete output filter capacitor.

8. The power amplifier system of claim 6, further comprising a delay modification circuit in communication with the first power supply for adjusting the delay of the first power supply.

9. The power amplifier system of claim 6, further comprising a second, closed-loop regulator connected in parallel with the open first power supply for additionally supplying supply voltage to the power amplifier.

10. The power amplifier system of claim 9, wherein the second regulator includes a linear regulator.

11. The power amplifier system of claim 9, wherein the second regulator includes a switching regulator having a switching frequency greater than the switching frequency of the first power supply.

12. The power amplifier system of claim 9, further comprising a delay modification circuit in communication with the first power supply for adjusting the delay of the first power supply.

13. The power amplifier system of claim 12, wherein the second regulator includes a linear regulator.

14. The power amplifier system of claim 12, wherein the second regulator includes a switching regulator having a switching frequency greater than the switching frequency of the first power supply.

* * * * *